US012516836B2

(12) United States Patent
Lehman et al.

(10) Patent No.: US 12,516,836 B2
(45) Date of Patent: Jan. 6, 2026

(54) SELF-CLEANING DEVICE FOR GENERATING IONS

(71) Applicant: Global Plasma Solutions, Inc., Charlotte, NC (US)

(72) Inventors: Joseph Lehman, Mooresville, NC (US); Kevin Terry, Charlotte, NC (US); Somnanritha Chan, Matthews, NC (US)

(73) Assignee: Global Plasma Solutions, Inc., Charlotte, NC (US)

( * ) Notice: Subject to any disclaimer, the term of this patent is extended or adjusted under 35 U.S.C. 154(b) by 554 days.

(21) Appl. No.: 17/898,886

(22) Filed: Aug. 30, 2022

(65) Prior Publication Data

US 2023/0065898 A1 Mar. 2, 2023

Related U.S. Application Data

(60) Provisional application No. 63/238,340, filed on Aug. 30, 2021.

(51) Int. Cl.
*F24F 8/30* (2021.01)
*H01J 37/08* (2006.01)

(52) U.S. Cl.
CPC ................ *F24F 8/30* (2021.01); *H01J 37/08* (2013.01)

(58) Field of Classification Search
CPC . B08B 1/165; B08B 1/32; H01T 23/00; H01J 37/08; A61L 9/22; B03C 3/41;
(Continued)

(56) References Cited

U.S. PATENT DOCUMENTS 1,811,687 A 6/1931 Philip et al.
3,624,448 A 11/1971 Saurenman
(Continued)

FOREIGN PATENT DOCUMENTS

AU 2014214642 A1 8/2015
CA 2108790 A1 4/1995
(Continued)

OTHER PUBLICATIONS

Airmaid by Interzon product brochure; Sep. 2016; Interzon AB,Propellervagen 4A,SE-183 62 Taby, Sweden www.airmaid.com. 2 pages.
(Continued)

*Primary Examiner* — Jennifer Dieterle
*Assistant Examiner* — Sonji Turner
(74) *Attorney, Agent, or Firm* — Seth L. Hudson; Maynard Nexsen PC

(57) ABSTRACT

A device for generating ions that includes a housing with a first portion and a second portion having a cavity therein. A first voltage wire and a second voltage wire are electrically coupled to an ionization module. A first electrode is electrically coupled to the first voltage wire configured to emit ions and a second electrode electrically coupled to the second voltage wire is configured to emit ions. An electrode cleaning apparatus is slidingly disposed within the cavity of the housing configured to contact both the first electrode and the second electrode. The electrode cleaning apparatus is powered by a motor, causing the electrode cleaning apparatus to contact the first electrode and the second electrode for cleaning.

12 Claims, 10 Drawing Sheets

(58) Field of Classification Search
CPC ... B03C 3/32; B03C 3/743; F24F 8/30; B25D 11/08
See application file for complete search history.

(56) References Cited

U.S. PATENT DOCUMENTS

| | | | | |
|---|---|---|---|---|
| 3,652,897 | A | 3/1972 | Iosue et al. | |
| 3,769,695 | A | 11/1973 | Price et al. | |
| 3,968,405 | A | 7/1976 | Testone | |
| 4,031,599 | A | 6/1977 | Testone | |
| 4,117,326 | A | 9/1978 | Askman | |
| D253,281 | S | 10/1979 | Kim | |
| 4,216,518 | A | 8/1980 | Simons | |
| 4,263,636 | A | 4/1981 | Testone | |
| 4,264,343 | A | 4/1981 | Natarajan et al. | |
| 4,284,420 | A | 8/1981 | Borysiak | |
| D286,765 | S | 11/1986 | Prouty et al. | |
| 4,734,580 | A * | 3/1988 | Rodrigo | H01T 21/00 361/230 |
| 4,757,422 | A | 7/1988 | Bossard et al. | |
| 4,809,127 | A | 2/1989 | Steinman et al. | |
| 4,829,398 | A | 5/1989 | Wilson | |
| 5,034,651 | A | 7/1991 | Domschat | |
| 5,065,034 | A | 11/1991 | Kawanami et al. | |
| 5,084,077 | A | 1/1992 | Junker et al. | |
| D332,942 | S | 2/1993 | Julien | |
| D353,575 | S | 12/1994 | Macomber | |
| 5,464,754 | A | 11/1995 | Dennis et al. | |
| 5,492,557 | A | 2/1996 | Vanella | |
| 5,653,638 | A | 8/1997 | Nagata | |
| 5,737,176 | A | 4/1998 | Muz | |
| 5,741,352 | A | 4/1998 | Ford et al. | |
| 5,768,087 | A | 6/1998 | Vernitskiy | |
| 5,879,435 | A | 3/1999 | Satyapal et al. | |
| 5,931,989 | A | 8/1999 | Knutsson | |
| 6,019,815 | A | 2/2000 | Satyapal et al. | |
| 6,118,645 | A | 9/2000 | Partridge | |
| D434,523 | S | 11/2000 | Ford | |
| 6,156,099 | A | 12/2000 | Hironaka et al. | |
| D443,587 | S | 6/2001 | Sakasegawa | |
| 6,252,756 | B1 | 6/2001 | Richie, Jr. | |
| 6,330,146 | B1 | 12/2001 | Blitshteyn | |
| 6,350,417 | B1 | 2/2002 | Lau et al. | |
| 6,417,581 | B2 | 7/2002 | Hall | |
| 6,544,485 | B1 | 4/2003 | Taylor | |
| D476,298 | S | 6/2003 | Lee | |
| 6,576,046 | B2 | 6/2003 | Pruette | |
| 6,653,638 | B2 | 11/2003 | Fujii | |
| 6,680,033 | B2 | 1/2004 | Ishii | |
| 6,744,611 | B2 | 6/2004 | Yang et al. | |
| 6,744,617 | B2 | 6/2004 | Fujii | |
| 6,791,814 | B2 | 9/2004 | Adachi et al. | |
| 6,850,403 | B1 | 2/2005 | Gefter et al. | |
| 6,855,190 | B1 * | 2/2005 | Nikkhah | B03C 3/32 96/96 |
| 6,902,392 | B2 | 6/2005 | Johnson | |
| D533,832 | S | 12/2006 | Hock | |
| 7,177,133 | B2 | 2/2007 | Riskin | |
| 7,244,289 | B2 | 7/2007 | Su | |
| 7,256,979 | B2 | 8/2007 | Sekoguchi et al. | |
| 7,273,515 | B2 | 9/2007 | Yuen | |
| 7,408,759 | B2 | 8/2008 | Gefter et al. | |
| D587,198 | S | 2/2009 | Nagasawa | |
| 7,492,568 | B2 | 2/2009 | Takayanagi | |
| 7,497,898 | B2 | 3/2009 | Sato et al. | |
| 7,639,472 | B2 | 12/2009 | Sekoguchi et al. | |
| 7,716,772 | B2 | 5/2010 | Shih et al. | |
| 7,739,771 | B2 | 6/2010 | Powell, Jr. | |
| 7,764,482 | B2 | 7/2010 | Lee et al. | |
| 7,824,477 | B2 | 11/2010 | Kang et al. | |
| 7,916,445 | B2 | 3/2011 | Sekoguchi et al. | |
| 7,940,509 | B2 | 5/2011 | Orihara et al. | |
| 7,948,733 | B2 | 5/2011 | Hashimoto | |
| 7,961,451 | B2 | 6/2011 | Sekoguchi et al. | |
| 7,969,707 | B2 | 6/2011 | Riskin | |
| 7,995,321 | B2 | 8/2011 | Shimada | |
| 8,043,573 | B2 | 10/2011 | Parker et al. | |
| 8,053,741 | B2 | 11/2011 | Sekoguchi | |
| 8,106,367 | B2 | 1/2012 | Riskin | |
| 8,134,821 | B2 | 3/2012 | Fukai | |
| 8,328,902 | B2 | 12/2012 | Boyden et al. | |
| 8,351,168 | B2 | 1/2013 | Sicard | |
| 8,425,658 | B2 | 4/2013 | Lee | |
| 8,554,924 | B2 | 10/2013 | Holden et al. | |
| 8,710,455 | B2 | 4/2014 | Shiozawa | |
| 8,710,456 | B2 | 4/2014 | Klochkov | |
| 8,724,286 | B2 | 5/2014 | Uchida et al. | |
| 8,951,024 | B2 | 2/2015 | Ishii et al. | |
| 8,957,571 | B2 | 2/2015 | Riskin | |
| 9,293,895 | B2 | 3/2016 | Pucciani et al. | |
| D754,314 | S | 4/2016 | Ellis et al. | |
| 9,579,664 | B2 | 2/2017 | Marra | |
| 9,623,422 | B2 | 4/2017 | Overdahl | |
| 9,630,185 | B1 | 4/2017 | Riskin | |
| 9,630,186 | B2 | 4/2017 | Back | |
| 9,660,425 | B1 | 5/2017 | Sunshine | |
| 9,661,725 | B2 | 5/2017 | Gefter et al. | |
| 9,661,727 | B2 | 5/2017 | Gefter et al. | |
| 9,789,495 | B1 * | 10/2017 | Dunn | B03C 3/47 |
| 9,847,623 | B2 | 12/2017 | Sunshine | |
| 9,849,208 | B2 | 12/2017 | Waddell | |
| 9,859,090 | B2 | 1/2018 | Gefter | |
| 9,948,071 | B2 | 4/2018 | Chen et al. | |
| 9,985,421 | B2 | 5/2018 | Sunshine | |
| 10,020,180 | B2 | 7/2018 | Waddell | |
| 10,116,124 | B2 | 10/2018 | Sung et al. | |
| 10,153,623 | B2 | 12/2018 | Sunshine | |
| 10,258,922 | B2 | 4/2019 | Hsieh | |
| D848,945 | S | 5/2019 | Lin | |
| 10,297,984 | B2 | 5/2019 | Sunshine | |
| 10,322,205 | B2 | 6/2019 | Waddell | |
| 10,439,370 | B2 | 10/2019 | Sunshine | |
| 10,492,285 | B2 | 11/2019 | Lee et al. | |
| 10,566,769 | B2 | 2/2020 | Waddell | |
| 10,695,455 | B2 | 6/2020 | Waddell | |
| 10,710,098 | B2 | 7/2020 | Marra | |
| 10,737,279 | B2 | 8/2020 | Gefter et al. | |
| 10,758,947 | B2 | 9/2020 | Heymann et al. | |
| 10,786,818 | B2 | 9/2020 | Galbreath et al. | |
| 10,980,909 | B2 | 4/2021 | Okano et al. | |
| 10,980,911 | B2 | 4/2021 | Waddell | |
| 11,283,245 | B2 | 3/2022 | Waddell | |
| 2003/0072697 | A1 | 4/2003 | Taylor | |
| 2003/0147783 | A1 | 8/2003 | Taylor | |
| 2006/0193100 | A1 | 8/2006 | Izaki et al. | |
| 2007/0253860 | A1 | 11/2007 | Schroder | |
| 2007/0258183 | A1 * | 11/2007 | Takayanagi | H01T 23/00 361/220 |
| 2008/0130190 | A1 | 6/2008 | Shimada | |
| 2008/0160904 | A1 | 7/2008 | Yi et al. | |
| 2009/0052108 | A1 | 2/2009 | Innami | |
| 2009/0211459 | A1 | 8/2009 | Hu et al. | |
| 2009/0274592 | A1 * | 11/2009 | Bergeron | H01J 37/32568 422/186.04 |
| 2010/0157503 | A1 | 6/2010 | Saito et al. | |
| 2010/0172808 | A1 | 7/2010 | Igarashi | |
| 2010/0175391 | A1 | 7/2010 | Jee et al. | |
| 2012/0068082 | A1 * | 3/2012 | Noda | H01T 23/00 250/423 R |
| 2012/0097028 | A1 * | 4/2012 | Lee | B03C 3/88 96/29 |
| 2012/0154973 | A1 | 6/2012 | Vaynerman et al. | |
| 2014/0076162 | A1 | 3/2014 | Waddell et al. | |
| 2014/0078639 | A1 | 3/2014 | Waddell et al. | |
| 2014/0103793 | A1 | 4/2014 | Nishida et al. | |
| 2014/0147333 | A1 | 5/2014 | Morfill | |
| 2014/0233232 | A1 | 8/2014 | Radermacher | |
| 2015/0236484 | A1 * | 8/2015 | Chen | H01T 19/04 361/231 |
| 2015/0255961 | A1 * | 9/2015 | Chen | H01T 23/00 15/246 |
| 2016/0167059 | A1 | 6/2016 | Waddell | |
| 2016/0175852 | A1 * | 6/2016 | Waddell | B08B 1/32 96/51 |

(56) References Cited

U.S. PATENT DOCUMENTS

| | | | | |
|---|---|---|---|---|
| 2017/0040149 | A1* | 2/2017 | Waddell | H01T 23/00 |
| 2017/0232131 | A1 | 8/2017 | Waddell | |
| 2017/0274113 | A1 | 9/2017 | Takasahara et al. | |
| 2018/0040466 | A1 | 2/2018 | Waddell | |
| 2018/0071426 | A1 | 3/2018 | Waddell | |
| 2018/0169711 | A1 | 6/2018 | Waddell | |
| 2018/0243462 | A1* | 8/2018 | Okano | B60H 3/0071 |
| 2019/0247893 | A1 | 8/2019 | Waddell | |
| 2019/0353359 | A1 | 11/2019 | Seibold | |
| 2020/0161839 | A1 | 5/2020 | Waddell | |
| 2020/0388994 | A1* | 12/2020 | Waddell | B03C 3/82 |

FOREIGN PATENT DOCUMENTS

| | | | | |
|---|---|---|---|---|
| CN | 107138028 | A | | 9/2017 |
| CN | 111228535 | A | | 6/2020 |
| DE | 3735219 | A1 | | 4/1989 |
| DE | 10355834 | A1 | | 7/2005 |
| DE | 202006006549 | U1 | | 8/2007 |
| DE | 102009035066 | A1 | | 3/2010 |
| DE | 102008062415 | A1 | | 7/2010 |
| DE | 202020102021 | U1 | | 4/2020 |
| EP | 0919287 | A2 | | 6/1999 |
| EP | 1878506 | A2 | | 1/2008 |
| EP | 2336665 | A1 | | 6/2011 |
| EP | 2683042 | A2 | | 1/2014 |
| EP | 2411058 | B1 | | 5/2015 |
| EP | 2905036 | A1 | | 8/2015 |
| EP | 3093564 | A1 | | 11/2016 |
| EP | 3165833 | A1 | | 5/2017 |
| EP | 3346560 | A1 | | 7/2018 |
| FR | 1494344 | A | | 9/1967 |
| GB | 1356211 | A | | 6/1974 |
| GB | 2117676 | A | | 10/1983 |
| GB | 2245200 | A | | 1/1992 |
| GB | 2301179 | A | | 11/1996 |
| GB | 2377660 | A | | 1/2003 |
| GB | 2415774 | A | | 1/2006 |
| GB | 2525280 | A | | 10/2015 |
| GB | 2529173 | A | | 2/2016 |
| JP | 0729668 | A | * | 1/1995 |
| JP | 09190051 | A | * | 7/1997 |
| JP | 2681623 | B2 | | 11/1997 |
| JP | 2002043092 | A | | 2/2002 |
| JP | 2004006152 | A | | 1/2004 |
| JP | 2009043580 | A | | 2/2009 |
| JP | 4778289 | B2 | | 9/2011 |
| JP | 2011 233301 | | | 11/2011 |
| JP | 5094492 | B2 | | 12/2012 |
| JP | 2017098139 | A | | 6/2017 |
| JP | 3259515 | B2 | * | 2/2022 |
| KR | 100776572 | B1 | | 11/2007 |
| KR | 20150072063 | A | * | 6/2015 |
| KR | 101589055 | B1 | | 1/2016 |
| KR | 20160138931 | A | | 12/2016 |
| KR | 101800326 | B1 | | 12/2017 |
| KR | 101816255 | B1 | | 1/2018 |
| WO | WO-8700089 | A1 | | 1/1987 |
| WO | WO-9820288 | A1 | | 5/1998 |
| WO | 2006039147 | A2 | | 4/2006 |
| WO | 2007009336 | A1 | | 1/2007 |
| WO | WO-2007131981 | A1 | | 11/2007 |
| WO | WO-2010014654 | A1 | | 2/2010 |
| WO | 2010074654 | A1 | | 7/2010 |
| WO | 2011136735 | A1 | | 11/2011 |
| WO | WO-2012176099 | A1 | | 12/2012 |
| WO | WO-2013173528 | A1 | | 11/2013 |
| WO | 2014047445 | A1 | | 3/2014 |
| WO | WO-2015052557 | A1 | | 4/2015 |
| WO | WO-2015101348 | A1 | | 7/2015 |
| WO | WO-2015111853 | A1 | | 7/2015 |
| WO | 2015138802 | A1 | | 9/2015 |
| WO | 2016000411 | A1 | | 1/2016 |
| WO | WO-2016082730 | A1 | | 6/2016 |
| WO | 2016134204 | A1 | | 8/2016 |
| WO | WO-2016147127 | A1 | | 9/2016 |
| WO | 2016204688 | A1 | | 12/2016 |
| WO | 2017022255 | A1 | | 2/2017 |
| WO | WO-2017067341 | A1 | | 4/2017 |
| WO | 2017085954 | A1 | | 5/2017 |
| WO | 2017152693 | A1 | | 9/2017 |
| WO | 2017155458 | A1 | | 9/2017 |
| WO | 2017168800 | A1 | | 10/2017 |
| WO | WO-2018175828 | A1 | | 9/2018 |
| WO | WO-2018189924 | A1 | | 10/2018 |
| WO | 2018234633 | A1 | | 12/2018 |
| WO | WO-2019000694 | A1 | | 1/2019 |
| WO | 2019108898 | A1 | | 6/2019 |
| WO | WO-2020037851 | A1 | | 2/2020 |
| WO | WO-2020056855 | A1 | | 3/2020 |
| WO | WO-2020078284 | A1 | | 4/2020 |
| WO | 2020158967 | A1 | | 8/2020 |
| WO | 2020186576 | A1 | | 9/2020 |
| WO | 2020218247 | A1 | | 10/2020 |

OTHER PUBLICATIONS

Extended European Search Report mailed on Sep. 28, 2021, in European Application No. 19750315.4, 60 pages.

Global Plasma Solutions. Link: https://gpshvac.com/wp-content/uploads/2017/07/GPS-FC48-AC-IOM-Rev-.pdf Visited Jul. 5, 2019. GPS-FC48-AC-IOM-Rev Self-Cleaning Ion Generator Device. (Year: 2019) 2 pages.

"Products" Web Page, http://www.gpshvac.com/index.php?option=com_content&view=article&id=11&itemid=93, 1 Page, Apr. 29, 2013, retrieved from Internet Archive Wayback Machine, https://web.archive.org/web/20130429232411/http://www.gpshvac.com/index.php?option=com_content&view=article&id=11&1temid=93 on Jan. 20, 2017.

"RGF Environmental Air Purification Technologies—Guardian Air HVAC Cell" Web Page, http://www.airstarsolutions.com/Pages/RGFguardian.aspx, 3 pages, Aug. 20, 2012, retrieved from Internet Archive Wayback Machine, https://web.archive.org/web/20120820000149/http://www.airstarsolutions.com/Pages/RGFguardian.aspx on Jan. 20, 2017.

Pushpawala Buddhi, et al., "Efficiency of Ionizers in Removing Airborne Particles in Indoor Environments." Journal of Electrostatics, vol. 90, pp. 79-84, Dec. 2017.

Wang, Wei, et al., "Assessment of Indoor Air Quality Using Different Air-Condition for Cooling." Advanced Materials Research, vol. 518-523, pp. 910-913, May 2012.

Wang, Yun Han, et al., "Research Progress of Air Purifier Principles and Material Technologies." Advanced Materials Research, vol. 1092-1093, pp. 1025-1028, Mar. 2015.

K. Nishikawa and H. Nojima, "Air purification technology by means of cluster ions generated by discharge plasma at atmospheric pressure." The 30th International Conference on Plasma Science, 2003. ICOPS 2003. IEEE Conference Record—Abstracts, pp. 379-, 2003.

* cited by examiner

SELF-CLEANING DEVICE FOR GENERATING IONS

CROSS-REFERENCE TO RELATED PATENT APPLICATION

The present patent application/patent claims the benefit of priority of U.S. Provisional Patent Application No. 63/238,340, filed on Aug. 30, 2021, and entitled "DEVICE FOR PRODUCING IONS WITH CLEANING BAR," the contents of which are incorporated in full by reference herein.

FIELD OF THE INVENTION

The present invention relates generally to the field of air treatment and cleaning a device for generating ions for treating the air, and more particularly to the treatment of air using ionization, whereby the electrodes of the ion generating device are cleaned by a cleaning apparatus that slides within the housing of the ion generating device, contacting the electrodes for cleaning.

BACKGROUND OF THE INVENTION

Air and other fluids are commonly treated and delivered for a variety of applications. For example, in heating, ventilation and air-conditioning (HVAC) applications, air may be heated, cooled, humidified, dehumidified, filtered or otherwise treated for delivery into residential, commercial or other spaces. One option to treat air is to use a device that produces ions that are emitted into the surrounding air. The ions are emitted through emitters that need to remain free of dust and debris to remain fully functional.

Needs exist for improved systems and methods of treating and delivering air that automatically clean the emitters. It is to the provision of improved systems and methods meeting these needs that the present invention is primarily directed.

BRIEF SUMMARY OF THE INVENTION

According to an embodiment of the present invention, a device for generating ions is disclosed that includes a housing containing a first electrode and a second electrode and a cleaning apparatus, contained within the housing and driven by a motor contained within the housing, contacts the electrodes when it moves, cleaning the electrodes.

According to another embodiment of the present invention, a device for generating ions is disclosed that includes a housing with a first portion and a second portion, a first electrode and a second electrode are contained within the housing and disposed adjacent a cleaning apparatus, whereby the cleaning apparatus contacts the electrodes when it moves, cleaning the electrodes.

According to yet another embodiment of the present invention, a device for generating ions is disclosed that includes a housing with a first portion and a second portion, a mounting member is engaged to the housing for mounting the housing to a substrate, such as a duct, wall, or the like

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Figure 1:
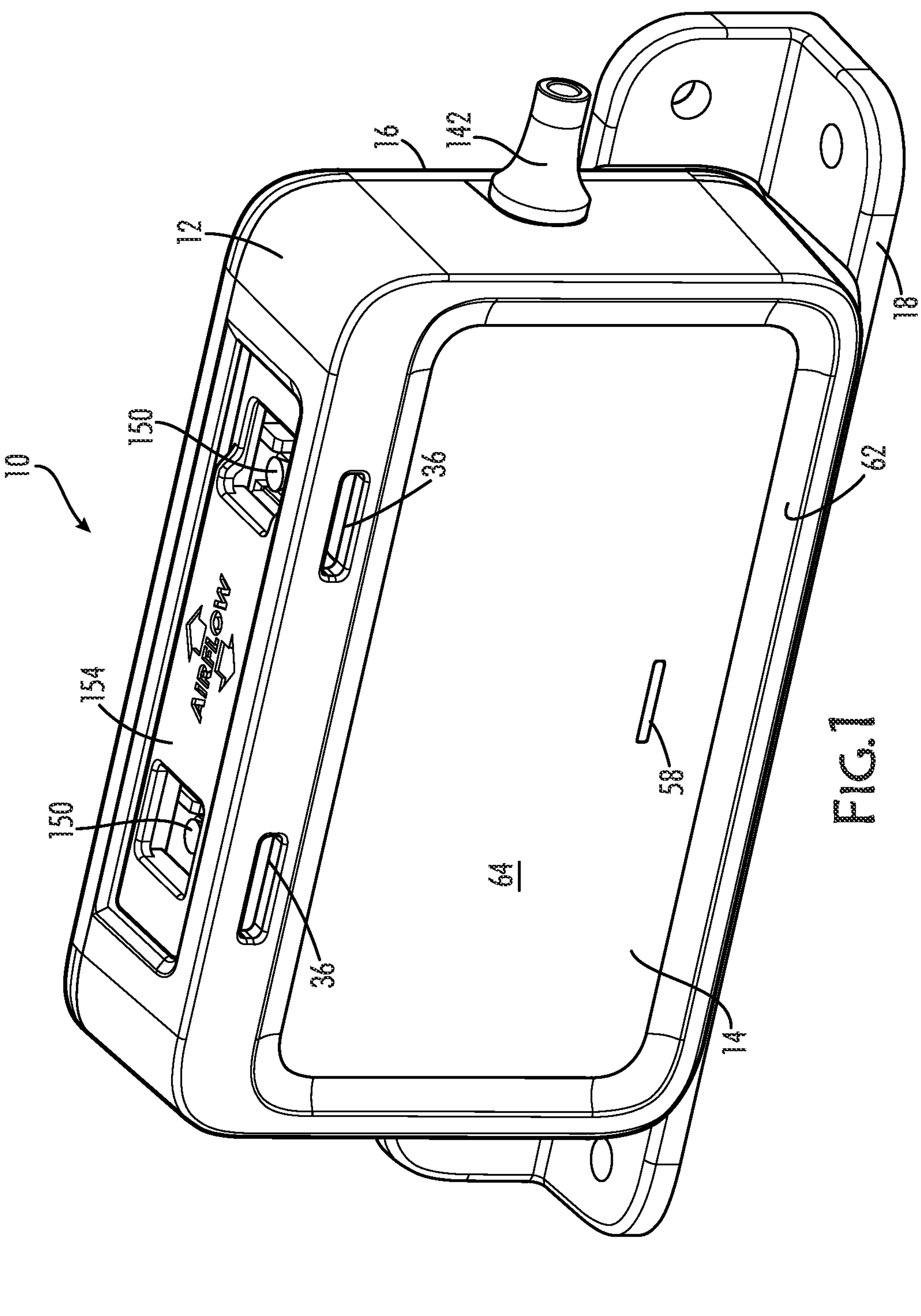
FIG. 1 is a perspective view of an exemplary device for generating ions.
Figure 2:
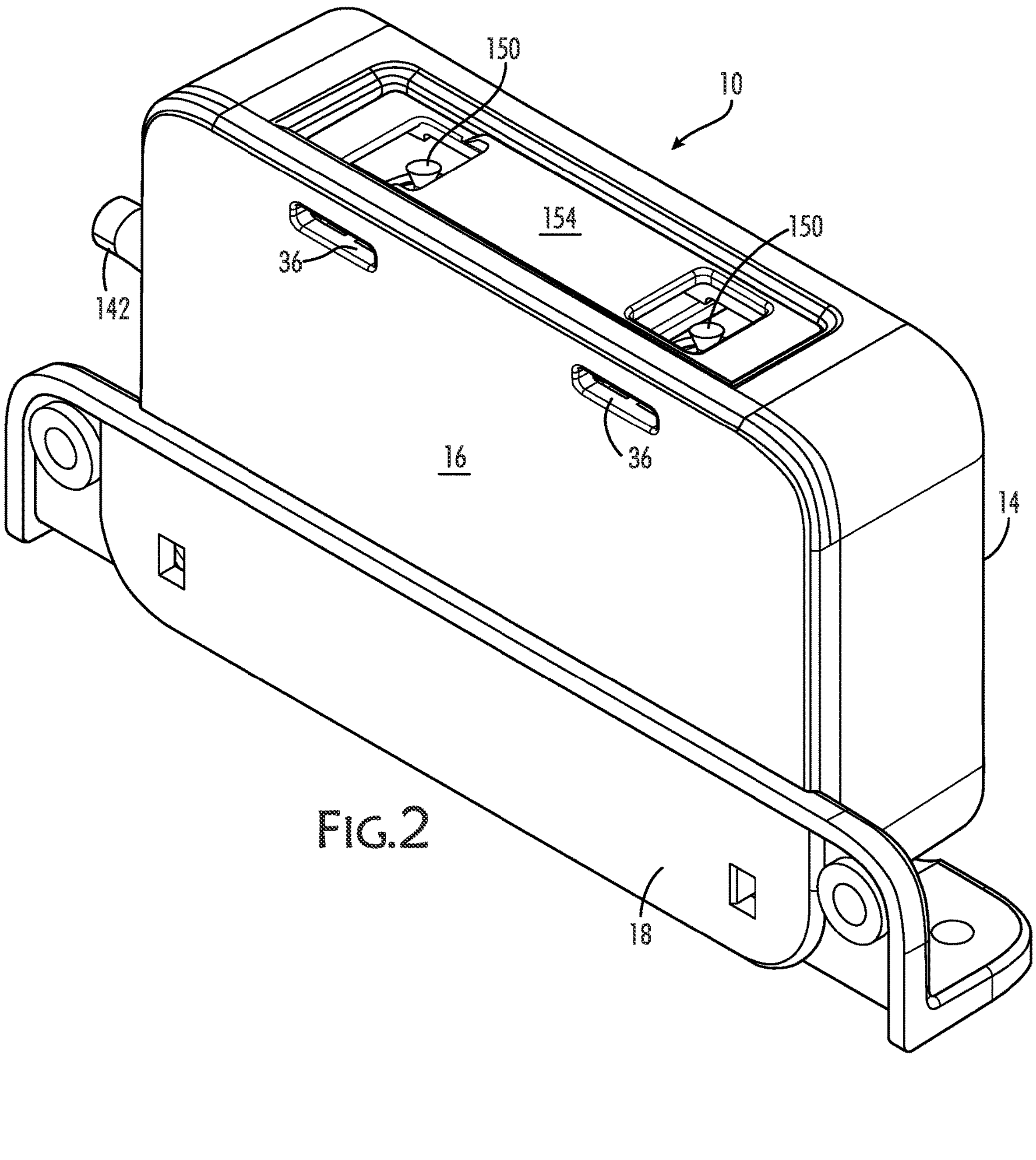
FIG. 2 is another perspective view of an exemplary device for generating ions.
Figure 3:
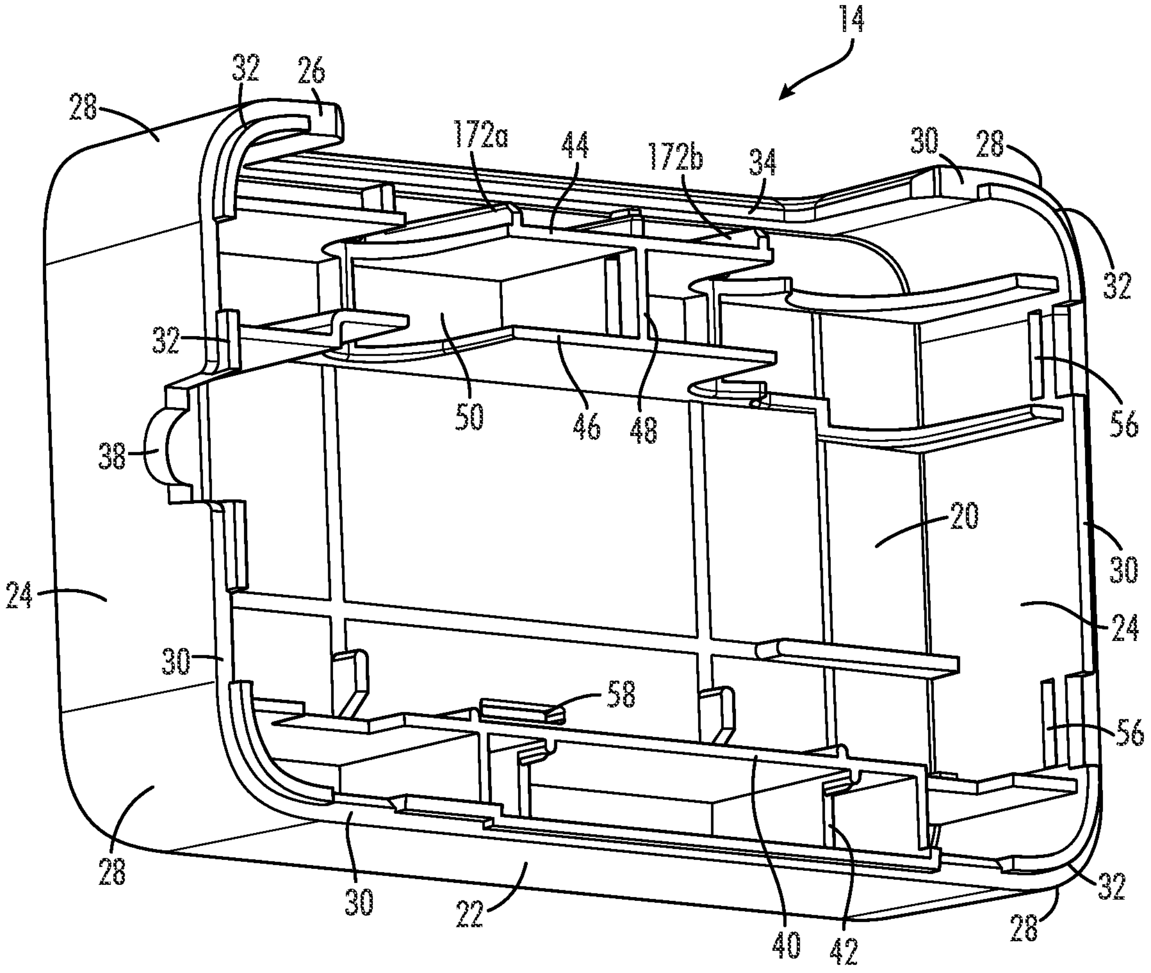
FIG. 3 is a perspective view of the exemplary first portion of the housing of the device for generating ions.

Referring now specifically to the drawings, and as illustrated in FIGS. 1-8, a device for generating ions is shown generally at reference numeral 10. The device 10 includes a housing 12 having a first portion 14 and a second portion 16. The first portion 14 is engaged to the second portion 16, collectively forming the housing 12. As illustrated, the housing 12 may have a rectangular cross-section; however, the housing 12 may also have a rectangular, triangular, trapezoidal, parallelogram cross-section and the like. As illustrated, the first portion 14 has a rectangular cross-section and the second portion 16 has a corresponding rectangular cross-section. As shown in FIG. 3, the first portion 14 contains a base portion 20 with an exterior surface and an interior surface, the base portion 20 extends to an outer edge. A back portion 22 extends outward from a portion of the outer edge and away from the base portion 14 to an upper edge 30. Two-opposed side portions 24 extend outward from opposed portions of the outer edge on either side of the back portion 22 to an upper edge 30. A top portion 26 extends outward from a portion of the outer edge, opposite the back portion 22, to an upper edge 30. The back portion 22 interconnects the two-opposed side portions 24, defining corners 28, and the top portion 26 interconnects the two-opposed side portions 24, defining corners 28. The corners 28 are preferably rounded or curved corners, meaning the corners 28 do not have a sharp edge or point. The back portion 22, the two-opposed side portions 24, and the top portion have an exterior surface and an interior surface.

Engaging ribs 32 may be disposed on the upper edge 30 of the back portion 22, two-opposed side portions 24, the top portion 26, and rounded corners 28. Preferably a plurality of engaging ribs 32 are disposed on the upper edge 30, wherein a first portion of the engaging ribs 32 is adjacent the upper edge 30 of the back portion 22, two-opposed side portions 24, the top portion 26, and rounded corners 28. The engaging ribs 32 extend away from the upper edge 30 to a second portion. The engaging ribs 32 are preferably spaced-apart from each other. An ion opening 34 is disposed within the top portion 26. The ion opening 34 contains two side portions that extend from the upper edge 30 to a distance along the top portion 26, containing a base portion. The two side portions are preferably the same length and the base portion extends between each of the side portions and adjacent the base portion 20, separated from the base portion 20 by a portion of the top portion 26 having a length smaller than the length of the top portion 26 on each side of the ion opening 34. A conduit cavity 38 is disposed on one of the side portions 24.

A board internal support 40 is disposed within the cavity 32 and spaced-apart from the back portion 32 by board support ribs 42. The board support ribs 42 have a first end engaged to the interior surface of the back portion 32 and the second end is engaged to the underside of the board internal support 40. Each end of the board internal support 40 is engaged to the interior surface of the two-opposed side portions 24, or alternatively, each end of the board internal support 40 may be engaged to the interior surface of the rounded corners 28 adjacent the two-opposed side portions 24. The back side of the board internal support 40 is engaged to the internal surface of the base portion 20 and the front side is oriented outwards and towards the second portion 16 when the first portion 14 and the second portion 16 are engaged.

An upper internal support 44 and a lower internal support 46 are also disposed within the cavity 32 and spaced-apart from each other. While the board internal support 40 is in close proximity to the back portion 22, the upper internal support 44 and the lower internal support 46 are located closer in proximity to the top portion 26 than the board internal support 40 is located to the top portion 26. A connection rib 48 extends between the upper internal support 44 and the lower internal support 46, wherein the first end is engaged to the upper internal support 44 and the second end is engaged to the lower internal support 46. Both the upper internal support 44 and the lower internal support 46 contain a first electrode assembly receptacle 50 and a second electrode assembly receptacle 52. The first electrode assembly receptacle 50 and the second electrode assembly receptacle 52 are spaced-apart from each other and are preferably partially annular. A motor receptacle 54 is also disposed within the upper internal support 44 and the lower internal support 46. The motor receptacle 54 is preferably partially annular and disposed in close proximity to the second electrode assembly receptacle 52. The first end and the second end of the upper internal support 44 and the lower internal support 46 are engaged to the interior surfaces of the two-opposed side portions 24, or alternatively, each end of the upper internal support 44 and the lower internal support 46 may be engaged to the interior surface of the rounded corners 28 adjacent the two-opposed side portions 24. The back side of the upper internal support 44 and the lower internal support 46 are engaged to the interior surface of the base portion 20 and the front end is oriented outwards and towards the second portion 16 when the first portion 14 and the second portion 16 are engaged.

Retention slots 56 are disposed on the interior surface of the back portion 22, two-opposed side portions 24, and/or top portion 26. The retention slots 56 are preferably rectangular in shape. A light aperture 58 is disposed within the base portion 20, extending from the interior surface to the exterior surface. At least two air flow apertures 36 may also be disposed on the interior surface of the base portion 20, extending from the interior surface to the exterior surface and disposed in closer proximity to the top portion 26 than the light aperture 58. The exterior surface of the base portion 20 may include a channel 62 that circumscribes an indicia marking portion 64. The indicia marking portion 64 may be utilized for containing indicia, such as a manufacturer's name, product name, or the like. The indicia marking portion 64 may be recessed at a height below the height of the exterior surface opposite the channel 62. Alternatively, the indicia marking portion 64 may be raised or positioned at a height above the height of the exterior surface opposite the channel 62.

Figure 4:
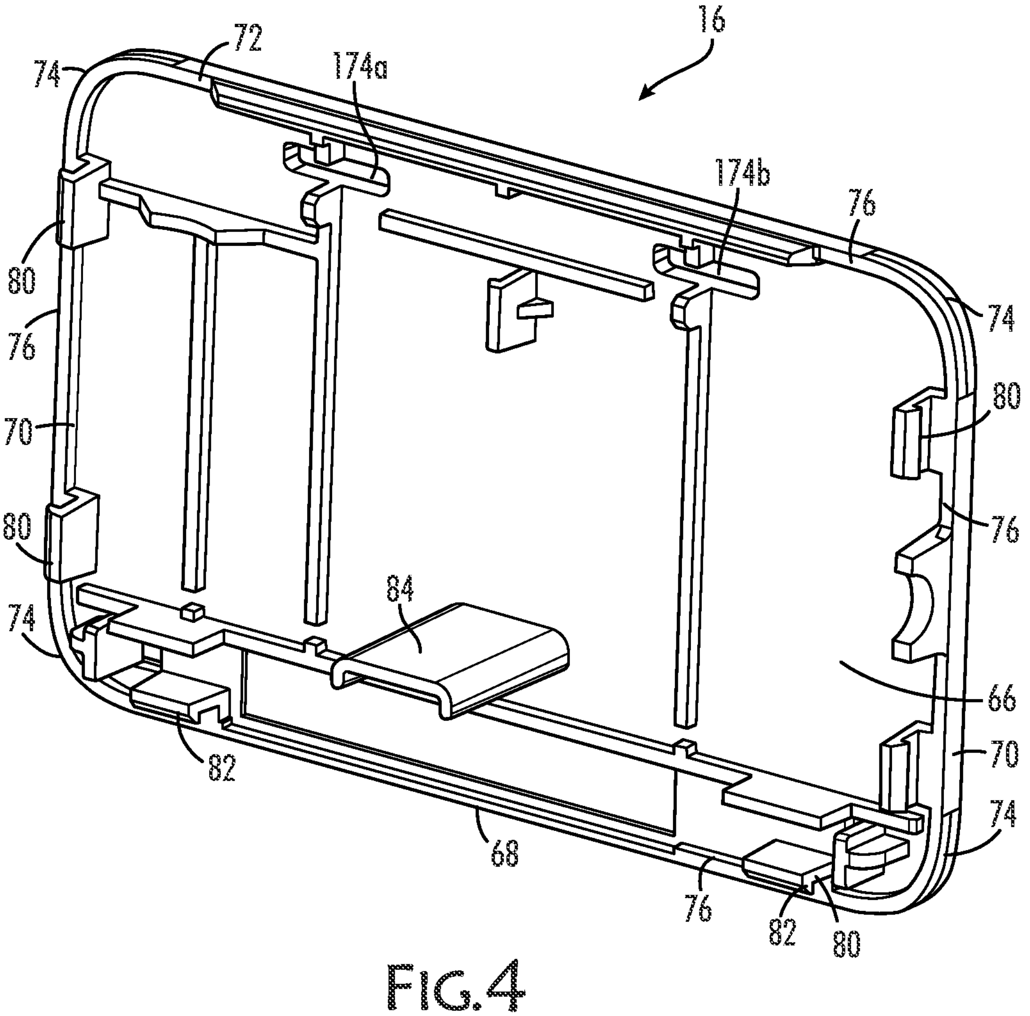
FIG. 4 is a perspective view of the exemplary second portion of the housing of the device for generating ions.

As illustrated in FIG. 4, the second portion 16 contains a base portion 66 with an exterior surface and an interior surface that extends to an outer edge. A back portion 68 extends outward from a portion of the outer edge and away from the base portion 14 to an upper edge 76. A pair of opposed side portions 70 extend outward from the outer edge and away from the interior surface of the base portion 66 of the second portion 16. Two-opposed side portions 70 extend outward from opposed portions of the outer edge on either side of the back portion 68 to an upper edge 76. A top portion 72 extends outward from a portion of the outer edge, opposite the back portion 68, to an upper edge 76. The back portion 68 intersects the two-opposed side portions 70, defining corners 74, and the top portion 72 intersects the two-opposed side portions 70, defining corners 74. The corners 74 are preferably curved or rounded corners, meaning the corners 74 do not have a sharp edge or point. The back portion 68, two-opposed side portions 70, the top portion 72, and rounded corners 74 contain an exterior surface and an interior surface. The interior surfaces of the base portion 20, back portion 22, two-opposed side portions 24, top portion 26, and rounded corners 28 of the first portion 14, and the interior surfaces of the base portion 66, back portion 68, two-opposed side portions 70, the top portion 72, and rounded corners 74 of the second portion 16 collectively form a cavity 32 within the housing 12 when the first portion 14 and the second portion 16 are engaged to each other.

Retention devices 80 extend outwardly from the back portion 68 and/or two-opposed side portions 70 of the second portion 16. The retention devices 80 may extend outwardly from the back portion 68 or the two-opposed side portions 70. Alternatively, and as illustrated, the retention devices 80 extend outwardly from the back portion 68 and two-opposed side portions 70. The retention devices 80 contain a first end engaged to the back portion 68 and two-opposed side portions 70 and extend upwardly to a second end containing a lip 82. The retention device 80 is preferably resiliently flexible allowing a certain degree of flexibility about the first end. The lip 82 is perpendicular to the longitudinal axis of the retention device 80 and faces away from the cavity 32. The lip 82 is designed to be received within the retention slots 56 disposed on the internal surfaces of the back portion 22, two-opposed side portions 24, and/or top portion 26 of the first portion 14 for making a latching engagement with the first portion 14, thus engaging the first portion 14 to the second portion 16. The first portion 14 and the second portion 16 collectively form the housing 12 and may be selectively secured to each other or integral to each other when engaged. Selectively secured means the first portion 14 and the second portion 16 are intended to be separated from each other and may be separated from each other without damaging the first portion 14 or second portion 16. On the other hand, integral means the first portion 14 and the second portion 16 are meant to remain secured to each other once joined and cannot be separated from each other without the likelihood of damaging either the first portion 14 or second portion 16.

A light support member 84 extends from the internal surface of the base portion 66. The light support member 84 contains a first end and a second end. The first end is engaged to the internal surface of the base portion 66 and extends outwardly through the cavity 32. The light support member 84 is positioned above the board internal support 40 and the control module 140 positioned on the board internal support 40 when the first portion 14 and second portion 16 are engaged. The light support member 84 preferably contains a "c-shaped" profile with a top portion that extends outward to two-opposed curved side portions, forming a "c-shaped" channel within the interior surfaces of the top portion and two-opposed curved side portion. A light emitting device 88 has a first curved portion that is engaged to the control module 140. The first curved portion has an external shape similar to the "c-shaped" channel of the light support member 84, wherein a portion of the first curved portion is received and retained within the "c-shaped" channel of the light support member 84. The second portion of the light emitting device 88 contains a light source, such as a light emitting diode (LED) light. The light emitting device 88 is positioned in a manner that the light, such as the LED light, is adjacent the light aperture 58 of the first portion 14 so that the light is visible through the light aperture 58. The second end of the light emitting device 88 may be inserted into the light aperture 58.

Figure 8:
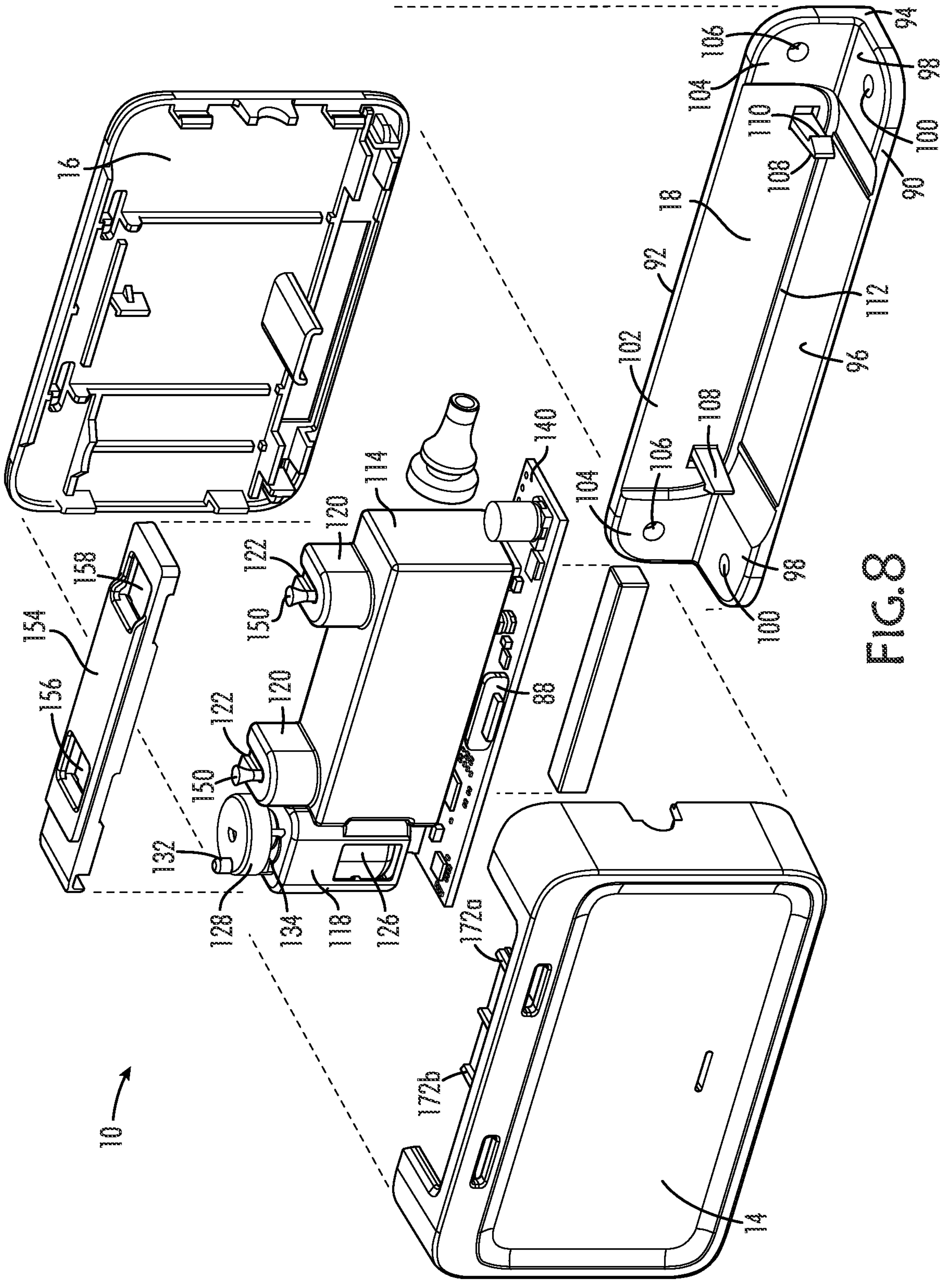
FIG. 8 is an exploded view of the exemplary device for producing ions.

The mounting member 18, as illustrated in FIG. 8, contains a base member 90 and a side member 92 oriented substantially perpendicular to the base member 90. The base member 90 contains an interior surface, an exterior surface, a back edge, a front edge, and two-opposed side edges. The side member 92 contains an interior surface, an exterior surface, a back edge, a front edge, and two-opposed side edges. The back edge of the base member 90 and the back edge of the side member 92 are interconnected, defining a corner 94. The base member 90 contains a receiving surface 96. The receiving surface 96 contains a profile similar to the profile of the back portion 22 and rounded corners 28 of the first portion 14 of the housing 12, wherein the back portion 22 and a portion of the rounded corners 28 of the first portion 14 may be placed adjacent or seated on the receiving surface 96. The interior surface of the base member 90 contains two side portions 98 spaced-apart on each side of the receiving surface 96. The receiving surface 96 is concave and contains a first side and a second side, wherein the first side extends downwardly in a curved fashion from one side portion 98 to the base of the receiving surface 96 and the second side extends downwardly in a curved fashion from the second side portion 98 to the base of the receiving surface 96. It is preferable that the two side portions 98 contain a radius of curvature the same or similar to the radius of curvature of the rounded corners 28 of the first portion 14 of the housing 12. The two side portions 98 have a height greater than the height of the base. The base is generally flat and smooth extending between the first side and second side of the receiving surface 96. The base preferably has a length and width the same or similar to the length and width of the back portion 22 of the first portion 14 of the housing 12. A bore 100 is disposed within each side portion 98 extending from the internal surface to the external surface for receiving an engagement device, such as a screw, bolt, and the like.

The side member 92 contains a receiving surface 102. The receiving surface 102 contains a profile similar to the profile of the base portion 66, back portion 68, and rounded corners 74 of the second portion 16 of the housing 12, wherein the base portion 66, back portion 68, and rounded corners 74 of the second portion 16 may be placed adjacent or seated on the receiving surface 102. The interior surface of the side member 92 contains two side portions 104 spaced-apart on each side of the receiving surface 102. The receiving surface 102 is concave and contains a first side and a second side, wherein the first side extends downwardly in a curved fashion from one side portion 104 to the base of the receiving surface 96 and the second side extends downwardly in a curved fashion from the second side portion 104 to the base of the receiving surface 102. It is preferable that the two side portions 104 contain a radius of curvature the same or similar to the radius of curvature of the rounded corners 74 of the second portion 16 of the housing 12. The two side portions 104 have a height greater than the height of the base. The base is generally flat and smooth extending between the first side and second side of the receiving surface 102. The base preferably has a length the same or similar to the length of the base portion 66 of the second portion 16 and a width the same or similar to the height of the two-opposed side portions and/or rounded corners 74 of the second portion 16 of the housing 12. A bore 106 is disposed within each side portion 104 extending from the internal surface to the external surface for receiving an engagement device, such as a screw, bolt, and the like.

Resiliently flexible fingers 108 extend outwardly from the interior surface of the side member 92 of the mounting member 18. As illustrated in FIG. 8, the two resiliently flexible fingers 108 are spaced-apart and extend outwardly in a cantilevered fashion over the base member 90. The resiliently flexible fingers 108 contain a first end engaged to the receiving surface 102 of the side member 92 and extend outwardly to a second end. The second end contains a lip 110. Each finger 108 is designed to be received within finger slots 86 disposed within the base portion 66 of the second portion 16 that extend from the interior surface to the exterior surface of the base portion 66 making a latching engagement with the second portion 16. The finger slots 86 are spaced-apart from each other and designed to receive a finger 108. The number of finger slots 86 corresponds to the number of fingers 108 on the mounting member 18. As illustrated, there are two fingers 108 extending from the mounting member 18 and two corresponding finger slots 86 within the base portion 66 of the second portion 16. As illustrated, the finger slots 86 are proximate the back portion 68 of the second portion 16. Each finger 108 is inserted through the finger slots 86, wherein the lip 110 engages the interior surface of the base portion 66 making a latching engagement between the second portion 16 and the mounting member 18. The exterior surface of the base portion 66 is adjacent the receiving surface 102, the rounded corners 74 are adjacent the first side and the second side of the receiving surface 102, and the back portion 68 is adjacent a chamfered surface 112 formed at the intersection of the interior surface of the base member 90 and the interior surface of the side member 92. When the first portion 14 of the housing 12 is engaged to the second portion 16, the back portion 22 is adjacent the receiving surface 96 of the base member 90 and the rounded corners 28 are adjacent the first side and the second side of the receiving surface 96. The mounting member 18 is engaged or selectively secured to the housing 12, and specifically the second portion 16 of the housing 12 for assisting with mounting the device 10 to a substrate, duct, wall or the like. During mounting, at least one engagement device is inserted into the bores 100 of the side portions 98 of the base member 90 and/or the bores 106 of the side portions 104 of the side member 92 and the at least one engagement device is attached to a substrate, wall, duct, or the like for retaining or mounting the device 10 to the substrate, wall, duct, or the like.

Figure 5A:
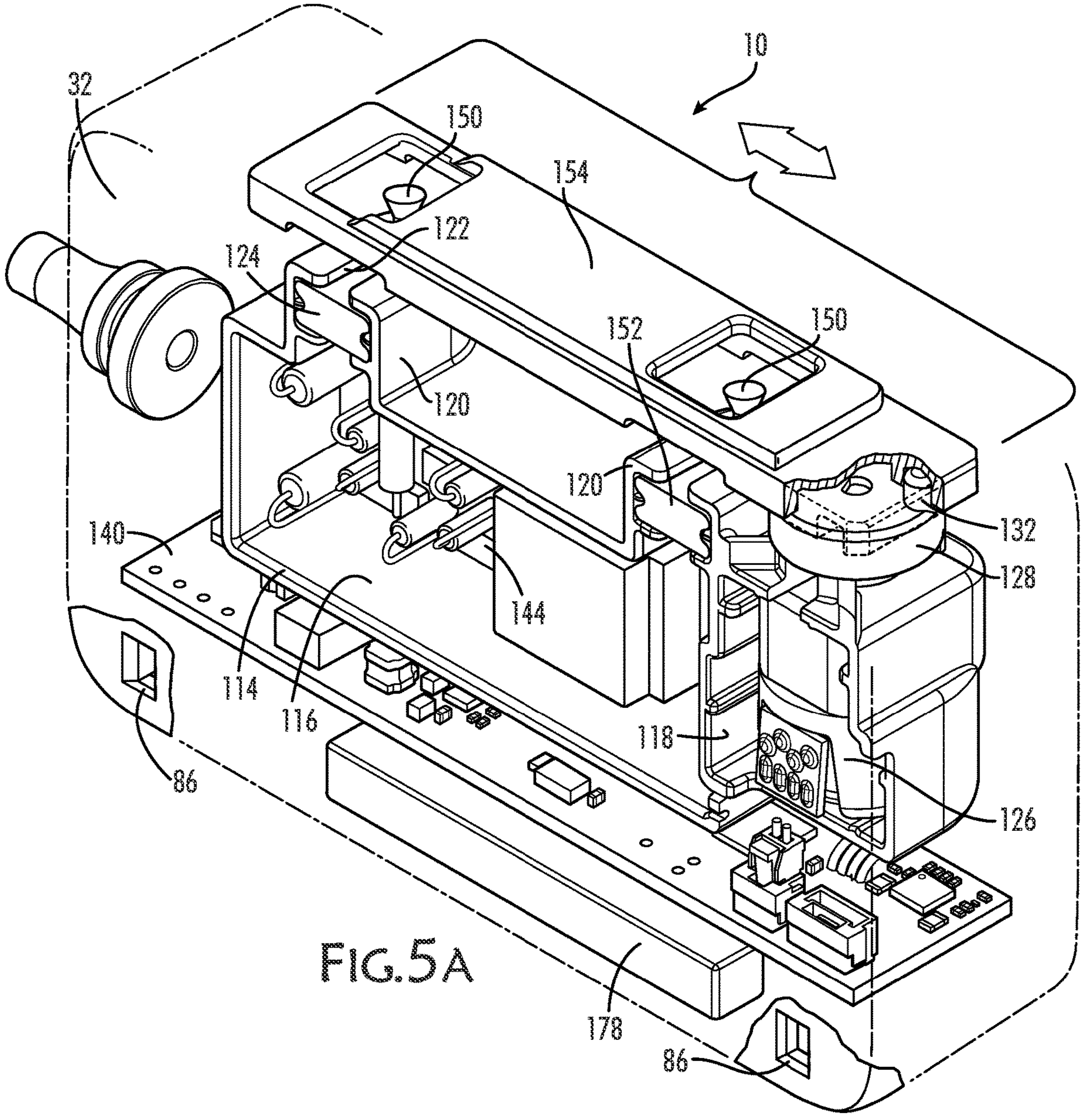
FIG. 5A is a perspective view of the internal components of the exemplary device for generating ions showing movement of the cleaning apparatus.
Figure 5B:
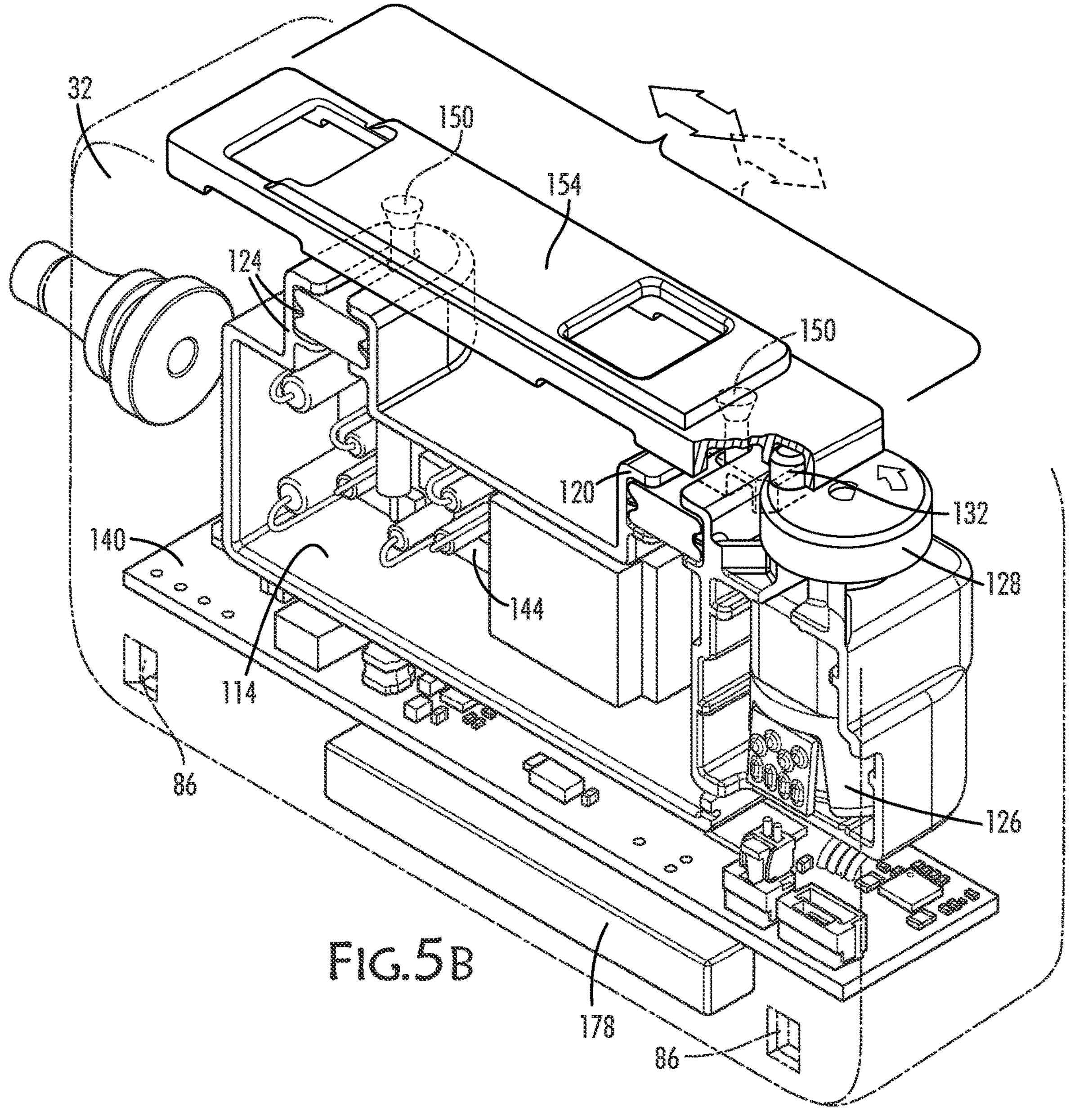
FIG. 5B is another perspective view of the internal components of the exemplary device for generating ions showing movement of the cleaning apparatus.

As best shown in FIGS. 5A, 5B, and 8, a casing 114 is disposed within the cavity 32 of the housing 12. The casing 114 houses various electrical and mechanical components used in the operation and function of the device 10. The casing 114 has a main portion 116, a motor cage 118, and two spaced-apart electrode uprights 120. The main portion 116 has a rectangular cross-sectional shape with a base portion that extends outward to an outer edge and two-pairs of opposed side portions extend upwardly from the outer edge and intersect at corners. The interior surfaces of the base portion and two-pairs of opposed side portions collectively form a cavity therein. The cavity is preferably not covered by a top portion or any other side portion or panel. The cavity is preferably open end at the opening or entrance to the cavity for inserting the electrical and mechanical components housed within the casing 114. When the casing 114 is positioned within the cavity 32 of the housing 12, the outer edge of the two-pairs of opposed side portions contact the interior surface of the base portion 66 of the second portion 16. In this arrangement, the base portion 66 effectively covers the cavity of the casing 114 when the first portion 14 and second portion 16 are engaged.

The main portion of the casing 114 is disposed between the board internal support 40 and the lower internal support 46. The motor cage 118 is adjacent a side portion of the main portion 116 of the casing 114 and designed to receive and house a motor 126. The motor cage 118 is positioned within the motor receptacles 54. The external end of the motor cage 118 is positioned adjacent the internal surface of the base portion 66 of the second portion 16, wherein the base portion 66 effectively covers the open side of the motor cage 118, preventing the motor 126 from exiting the motor cage 118. The two electrode uprights 120 extend outwardly from a side portion of the main portion 116 of the casing 114. The electrode uprights 120 are spaced-apart from each other and disposed proximate to different ends of a side portion of the main portion 116. The electrode uprights 120 have a "u-shaped" profile when viewed from above. The openings are also "u-shaped" when viewed from above, containing two sides extending parallel from an outer edge of the side portion. A curved end portion connects the two sides, forming the "u-shaped" opening within a side portion of the main portion 116 of the casing 114. The side portion of the electrode uprights 120 surrounds the opening and extends outwardly from the side portion of the main portion 116 to an upper edge that includes a top portion with electrode slots 122. The electrode slots 122 extend from an outer edge in the top portion to a length within the top portion, and preferably the electrode slots 122 do not extend along the entire length of the top portion. The electrode slots 122 are preferably centrally located within the top portion and extend from the exterior surface to the interior surface of the top portion. The interior surfaces of the side portions and top portion of the electrode uprights 120 collectively form an interior compartment that may be accessed through the cavity of the main portion 116 through the openings. The front portion of the electrode uprights 120 are open, meaning there is no portion or panel in front of the interior compartment. The electrode uprights 120 contain a side surface that surrounds and extends upwardly from correspondingly shaped openings in the side portion of the casing 114. The side surface contains two ends positioned spaced-apart from each other on opposite sides of the opening and the two ends of the side surface of each electrode upright 120 is positioned adjacent the interior side of the back portion 68 of the second portion 16 effectively covering the interior compartment preventing the components housed or retained within the electrode uprights 120 from exiting. At least one, and as illustrated, two electrode guides 124 are disposed within the interior compartment. The electrode guides 124 extend outward from the interior surface of the interior compartment of the electrode uprights 120 and preferably have a "u-shaped" configuration when viewed from above, similar to the electrode uprights 120. The electrode guides 124 are spaced-apart from each other and spaced-apart from the opening in the side of the casing 114 and the interior surface of the top portion.

Figure 6A:
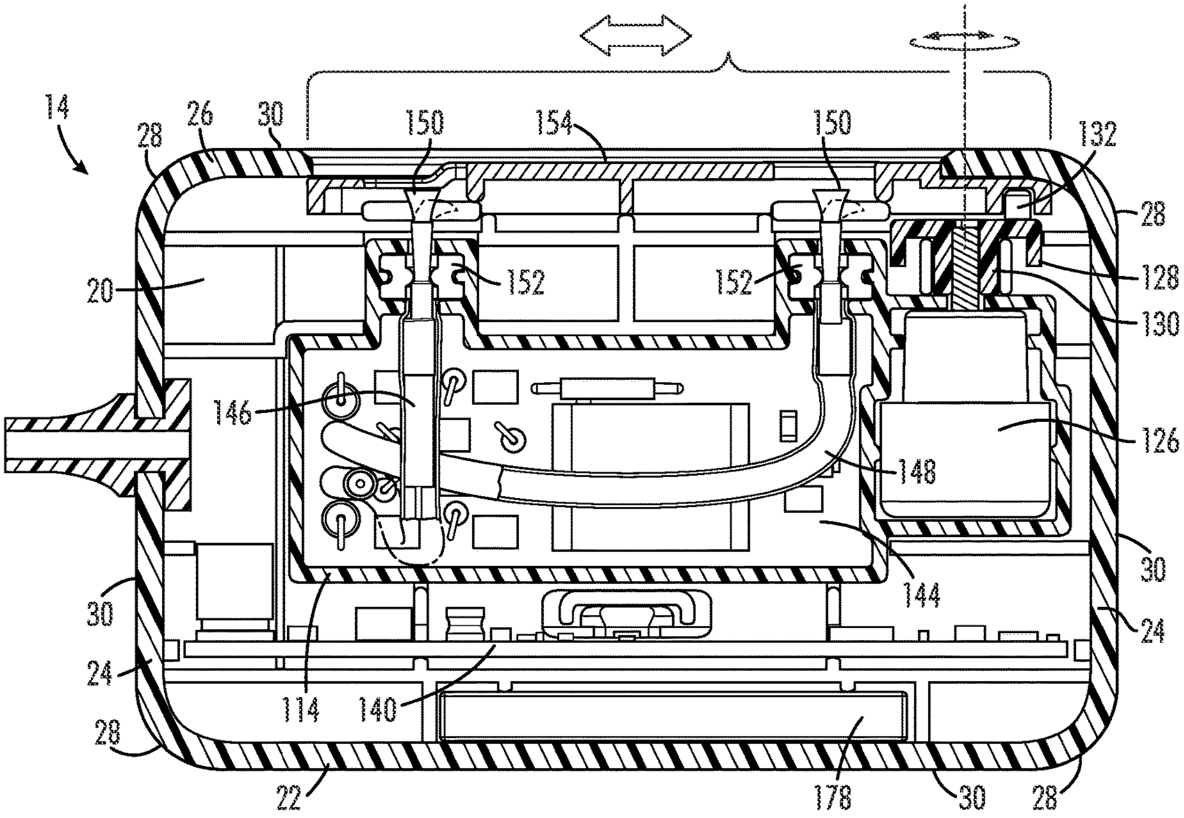
FIG. 6A is cut-away view of an exemplary device for generating ions showing movement of the cleaning apparatus.
Figure 6B:
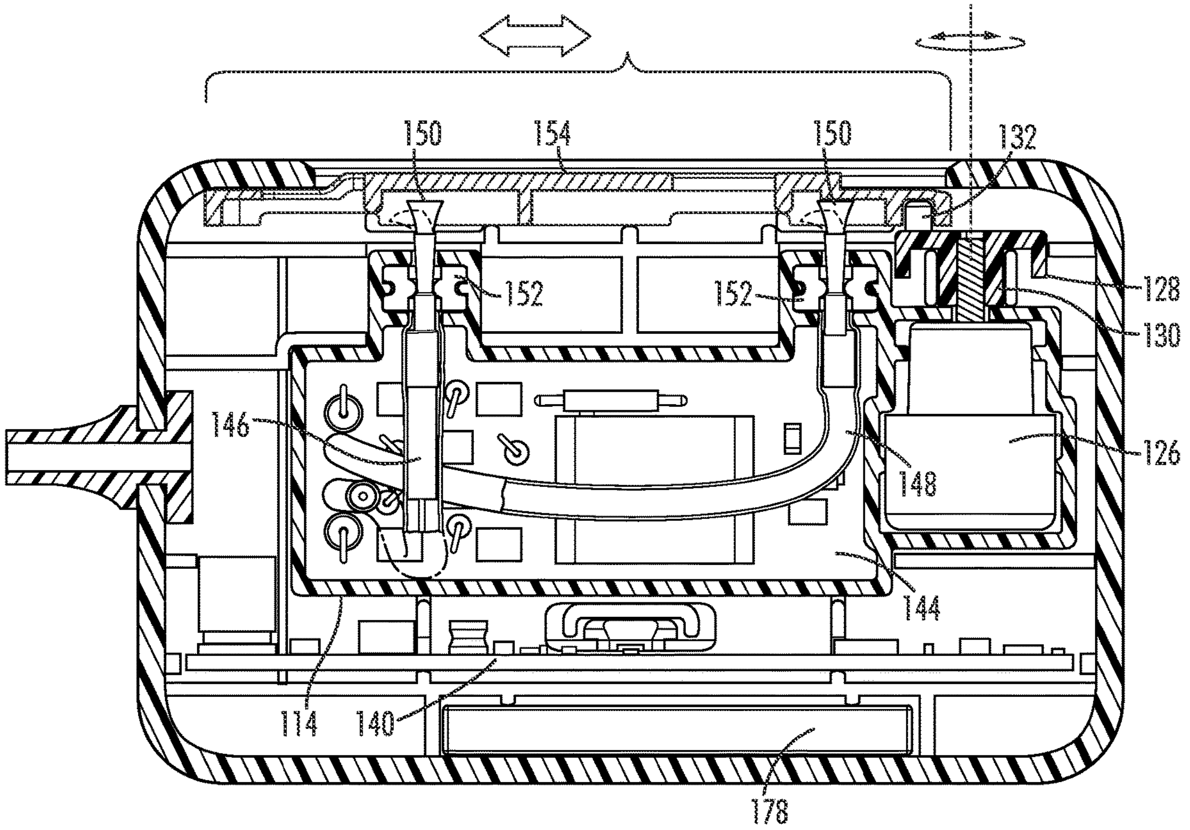
FIG. 6B is another cut-away view of an exemplary device for generating ions showing movement of the cleaning apparatus.

As shown in FIGS. 5A, 5B, 6A, 6B, and 8, a motor 126 is retained within the motor cage 118. The motor 126 contains an elongate rotational shaft that rotates when the motor 126 is in the "on" position, or when the motor is operating. The motor 126 receives power from an external power source for operating. The rotational shaft is engaged to a drive wheel 128. The rotational shaft is received within a receptacle 130, as shown in FIGS. 6A and 6B, of the drive wheel 128 extending downwardly from the drive wheel 128. Alternatively, the receptacle 130 may be recessed within the drive wheel 128. The receptacle 130 is disposed on the bottom portion of the drive wheel 128. The receptacle 130 may have a geometrically shaped cross-section that corresponds with a geometrically shaped cross-section of the rotational shaft forming a mating arrangement when the rotational shaft is received within the receptacle 130. For example, the cross-section of the receptacle 130 may be "D-shaped" and the cross-section of the rotational shaft is correspondingly "D-shaped", allowing the rotational shaft to be received within the receptacle 130, forming a mating arrangement by the corresponding geometric shapes. In this arrangement, as the rotational shaft rotates, the drive wheel 128 also rotates. The drive wheel 128 has a main body that is generally cylindrical with an outer circumferential edge. A knob 132 is disposed on the top portion of the drive wheel 128. As illustrated, the knob 132 is preferably disposed proximate the outer edge of the top portion and extends upward from the top portion of the drive wheel 128. The knob 132 is preferably cylindrical. As the drive wheel 128 is rotated, the knob 132 carried on the drive wheel 128 also rotates.

An optional drive wheel key 134 may be disposed between the motor 126 and the drive wheel 128. The drive wheel key 134 contains a hollow interior, allowing the rotational shaft of the motor 126 to extend through the hollow interior and receive the receptacle 130 of the drive wheel 128. The receptacle 130 may also be disposed within the hollow interior of the drive wheel key 134, and as illustrated, the bottom portion of the drive wheel 128 is disposed adjacent the upper edge of the drive wheel key 134 with the receptacle 130 extending downward and within the hollow interior for receiving the rotational shaft. A motor vibration isolator and a gear vibration mount may also be utilized. Both the motor vibration isolator and a gear vibration mount are disposed around components of the motor 126. The motor vibration isolator is disposed on the bottom portion of the motor 126 to dampen or isolate any vibration caused by the operation of the motor 126. The gear vibration mount is disposed on the top portion of the motor 126 and covering a portion of the rotational shaft to dampen or isolate any vibration caused by the rotational spinning of the rotational shaft or any other forces exerted by the motor 126 during operation. The motor vibration isolator and a gear vibration mount are composed of a material such as rubber or plastic that has properties to dampen or isolate any vibration caused by the motor or rotational shaft.

The motor 126 is electrically coupled to a control module 140 for supplying power to operate the motor 126 and control the operation of the motor by turning the motor to the "on" position and the "off" position. The control module 140 contains a printed circuit board ("PCB") that carries a transformer, high voltage diodes and the like. The control module 140 is engaged to an external power source for supplying the requisite power for the device 10. Preferably, the wiring supplying the power to the control module 140 from the external power source is routed through the housing 12 for connection to the external power source. The wiring is routed through a conduit 142 disposed within the conduit cavity 38 within a side portion 24 of the first portion 14. A power invertor may be included to convert the source voltage to the required input voltage of the device 10. The control module 140 is electrically coupled to an ionization module 144. The ionization module 144 may contain a printed circuit board ("PCB"). A power convertor may also be contained within the device 10 to receive an alternating electrical power and convert it to a direct electrical power. The power convertor is preferably disposed on the PCB of the control module 140. Additionally, or alternatively, the power converter may be configured to modify the received voltage, including modification of amplitude and frequency of the received voltage.

The control module 140, and specifically the printed circuit board of the control module 140, is positioned on the top side of the board internal support 40 and disposed within the cavity 32 of the housing 12, as shown in FIGS. 6A and 6B. The ionization module 144 is positioned within the casing 114 and preferably the printed circuit board of the ionization module 144 is disposed adjacent the base portion of the main portion 116 of the casing 114, wherein the casing 114, including the ionization module 144 is disposed within the cavity 32 of the housing 12. A positioning block 178 may be located underneath the board internal support 40.

A first voltage wire 146 and a second voltage wire 148, shown in FIGS. 6A and 6B, are electrically coupled to the ionization module 144. The control module 140 supplies the requisite power to the ionization module 144 and the ionization module 144 converts the low voltage from the control module 140 to a higher voltage for ion generation and the emission of ions from the electrodes 150. The first end of the first voltage wire 146 is electrically coupled to the ionization module 144 for carrying voltage to the second end of the first voltage wire 146. Likewise, the first end of the second voltage wire 148 is electrically coupled to the ionization module 144 for carrying voltage to the second end of the second voltage wire 148. The first voltage wire 146 and the second voltage wire 148 may be contained or partially surrounded by heat shrink tubing. The first voltage wire 146 and the second voltage wire 148 are preferably high voltage wires capable of withstanding, handling, and carrying high voltages from the ionization module 144.

Air ionizing electrodes 150 (e.g. needlepoint electrodes for emitting ions) are coupled to the second end of the first voltage wire 146 and the second voltage wire 148. The electrodes 150 may be composed of stainless steel, carbon fiber, tungsten, steel or other conductive material (e.g. a suitable metal). The electrodes 150 may consist of a plurality of carbon fibers extending outwardly from the second end of the first voltage wire 146 and the second voltage wire 148, as illustrated. In this embodiment, the electrodes 150, comprised of a plurality of carbon fibers, are coupled, for example by crimping, the electrode 150 to the second end of the first voltage wire 146 and the second end of the second voltage wire 148. In another embodiment, the electrode 150 is coupled to the second end of the first voltage wire 146 and the second voltage wire 148 by heat shrink. Current flows through the first voltage wire 146 and the second voltage wire 148, wherein the electrodes 150 emit ions at the end of the fibers distal the second end of the first voltage wire 146 and the second voltage wire 148 and into the surrounding air.

In one embodiment, the electrodes 150 are composed of a plurality of fibers composed of a thermoplastic polymer imbedded with conductive material that allows the polymer to conduct electricity. For example, the fibers may be composed of polypropylene or polyethylene and impregnated with carbon. Generally, the fibers may contain between about 20 to about 80 wt % polypropylene copolymer or polyethylene copolymer, between about 5 to about 40 wt % talc, and from about 5 to 40 wt % carbon black. However, any other resistive, inductive, reactive or conductive plastic or non-metallic material may be utilized for the fibers. The electrodes 150 are replaceable and allowed to be easily disengage and new, unused electrodes 150 may be coupled to the first voltage wire 146 and the second voltage wire 148.

In an example embodiment, the approximately equal amounts of positive and negative ions are generated and emitted regardless of airflow velocity or other conditions such as humidity or temperature. In some cases, the device 10 may be configured to have suitable mechanisms for controlling the amount of negative or positive ions based on the environmental conditions (e.g., the amount of ions may be dependent on an air flow rate, a direction of the airflow, a temperature of the air, a humidity of the air, an amount of pollution expected or observed in the air, and the like). The amount of pollution in the air may be expected (e.g., based on a location, such as hospital, indoor dining place, and the like) or may be observed (e.g., via suitable sensors such as air transparency sensors, humidity sensors, sensors detecting presence of a person or a crowd of people, and the like). In an example embodiment, positive and negative ions are generated and emitted in a concentration of at least about $10^9$ ions/second, and operates on 12V DC, 110V AC, or other power source. In alternate embodiments, an electrode 150 emits negative ions only, positive ions only, or negative and positive ions in unequal quantities. In example embodiments, the device 10 produces minimal or no ozone, for example at no greater concentration than in ambient air.

When the ionization module 144 is housed within the main portion 116 of the casing 144, the first voltage wire 146 and the second voltage wire 148 extend through the cavity of the main portion 116 from the ionization module 144 and into the interior compartment of the electrode uprights 120, through the electrode slots 122 in the top portion, as shown in FIGS. 6A and 6B. Within the electrode uprights 120, the first voltage wire 146 and the second voltage wire 148 are routed between the electrode guides 124 disposed within the interior compartment of the electrode uprights 120. The first voltage wire 146 and the second voltage wire 148 extend through the electrode slots 122 on the top portion of the electrode uprights 120. Alternatively, the second end of the first voltage wire 146 and the second voltage wire 148 may be positioned adjacent the electrode slots 122 of the top portion of the electrode uprights with the electrode 150 extending through the electrode slots 122, if the first voltage wire 146 and the second voltage wire 148 do not extend through the electrode slots 122. An emitter gland 152 may be disposed within the internal compartment of the electrode uprights 120. The emitter gland 152 preferably has a shape that corresponds to the shape of the internal compartment of the electrode uprights 120. The emitter gland 152 has a "u-shaped" cross-section when viewed from above with a channel disposed within its side portion between the top side and the bottom side. An opening extends from the top side to the bottom side for receiving the first voltage wire 146 or the second voltage wire 148, depending upon the particular electrode upright 120 it is received. One of the electrode guides 124 is received within the channel of the emitter gland 152 when the emitter gland 152 is inserted into the interior compartment of the electrode upright 120 and the first voltage wire 146 or the second voltage wire 148 extend through the opening in the emitter glands 152. The top side of the emitter gland 152 is positioned adjacent the bottom side of the uppermost electrode guide 124 or the electrode guide 124 not received within the channel. The emitter gland 152 provides additional stability, support, and retention to the first voltage wire 146 and the second voltage wire 148, extending through the electrical uprights 120 and may be composed of rubber, plastic, or the like.

Figure 7A:
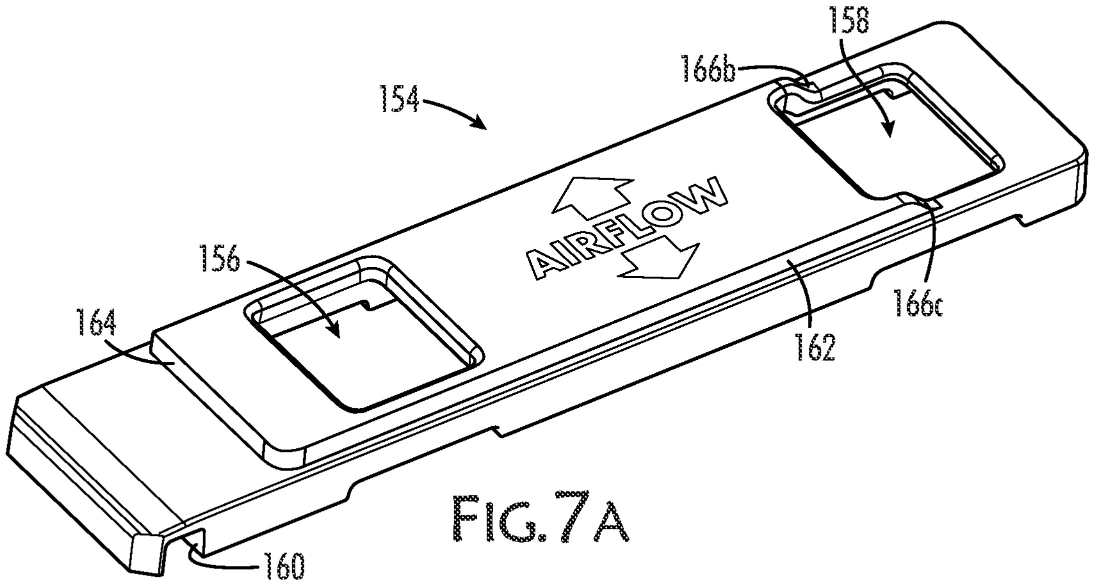
FIG. 7A is a top perspective view of the exemplary cleaning apparatus.
Figure 7B:
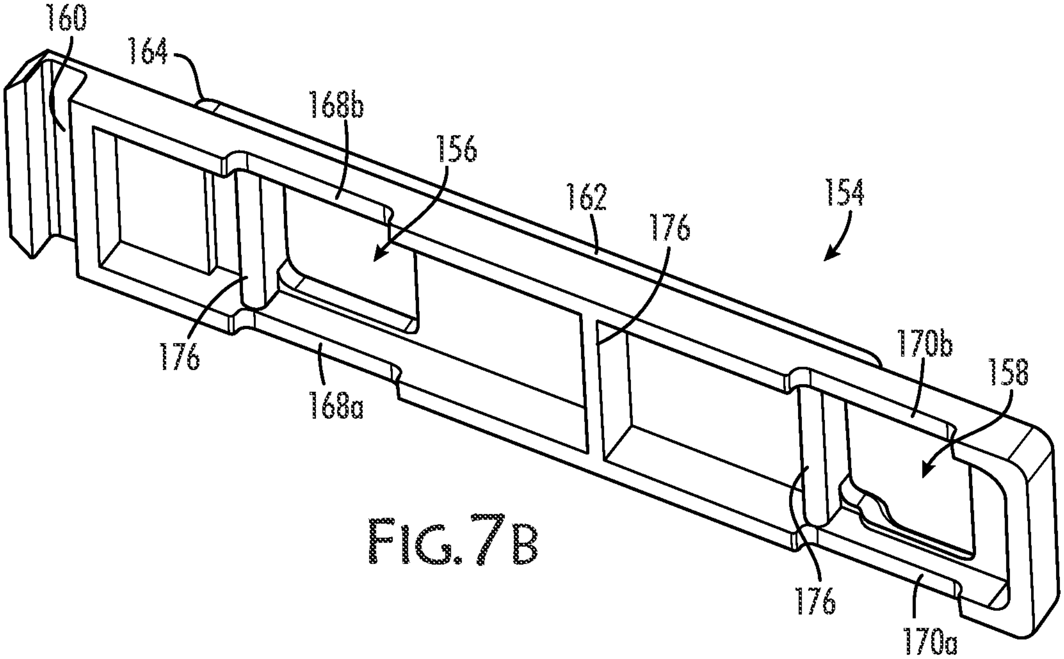
FIG. 7B is a bottom perspective view of the exemplary cleaning apparatus.

An electrode cleaning apparatus 154, as shown in FIGS. 7A and 7B, is disposed within the housing 12 of the device 10. The electrode cleaning apparatus 154, as illustrated is rectangular, and designed to contact the electrodes 150 and remove any particulate matter, such as dust or debris, that may have attached to the electrodes 150 during operation. While a rectangular electrode cleaning apparatus 154 is illustrated, the electrode cleaning apparatus 154 may have another geometric shape, such as a square, parallelogram, quadrilateral and the like. The electrode cleaning apparatus 154 has a top side, a bottom side, two opposed side portions, and two opposed end portions with a longitudinal axis extending between the two end positions. At least one emitter hole extends from the top side to the bottom side. As illustrated, the electrode cleaning apparatus 154 contains a first emitter hole 156 and a spaced-apart second emitter hole 158 extending from the top side to the bottom side. The first emitter hole 156 is proximate an end portion and the second emitter hole 158 is proximate the opposite end portion. The first emitter hole 156 and the second emitter hole 158 may have any shape or dimension, including but not limited to square, rectangular, circular, triangular, etc. As illustrated in FIGS. 7*a* and 7B, the first emitter hole 156 and the second emitter hole 158 have a square shape with identical dimensions (i.e. length, width, and height). The bottom side of the electrode cleaning apparatus 154, as shown in FIG. 7B, contains an axially extending slot 160 that extends from one side portion to the opposed side portion and disposed proximate one of the end portions. The knob 132 of the drive wheel 128 is slidingly engaged to the slot 160. The slot 160 has a width slightly larger than the diameter of the knob 132, allowing the knob 132 to be received within the slot 160, forming a slidingly engaged arrangement. As the drive wheel 128 rotates, causing the knob 132 to rotate, the knob 132 moves from its initial starting point adjacent one end of the slot 160 and slides along the length of the slot 160, causing the electrode cleaning apparatus 154 to slide within the housing 12. When the drive wheel 128 completes a full rotation, the knob 132 will have transversed the slot 160 twice. In other words, when the drive wheel 128 rotates 180°, or half a rotation, the knob 132 will transverse or move down the slot 160 once. When the drive wheel 128 rotates another 180°, completing a full 360° rotation, the knob 132 will transverse the slot 160 one additional time or reverse its previous path and return to its initial starting point. The slot 160 is preferably positioned axially perpendicular to the longitudinal axis extending between the two ends, and the knob 132 moves in a direction axially perpendicular to the longitudinal axis and back in a second direction, retracing its prior movement, axially perpendicular to the longitudinal axis.

As best shown in FIG. 7A, the top side of the electrode cleaning apparatus 154 has a partially raised surface 162 located between the two opposed ends and extending to edges of the top side adjacent the opposed side portions. The raised surface 162 extends longitudinally along the longitudinal axis of the electrode cleaning apparatus 154 and preferably surrounds the first emitter hole 156, preferably the first emitter hole 156 is located in closer proximity to the slot 160 than the second emitter hole 158. The raised surface 162 terminates at one end in the longitudinal direction, forming a shoulder 164. The shoulder 164 is preferably disposed proximate the location where the raised surface 162 surrounds the first emitter hole 156. The opposite end of the raised surface 162 preferably terminates proximate the second emitter hole 158, and more preferably partially surrounds the second emitter hole 158 with the end of the raised surface 162 terminating on either side of the second emitter hole 158, forming two tapered or angled surfaces 166*a* and 166*b*.

A first pair of notches 168*a*, 168*b* and a second pair of notches 170*a*, 170*b* are disposed within the opposed side portions. The first pair of notches 168*a*, 168*b* are disposed proximate the first emitter hole 156, and the second pair of notches 170*a*, 170*b* are disposed proximate the second emitter hole 158. The first pair of notches 168*a*, 168*b* are spaced apart and located with one notch 168*a* located within one side portion and the second notch 168*b* located within the opposed side portion. The first pair of notches 168*a*, 168*b* are aligned in the axial direction. Notch 168*a* is preferably proximate one axial side of the first emitter hole 156, and notch 168*b* is preferably proximate the second axial side of the first emitter hole 156. The first pair of notches 168*a*, 168*b* preferably each have the same dimensions (width, length, and height), wherein the length of the first pair of notches 168*a*, 168*b*, extending in the longitudinal direction, is the same or similar to the length of the first emitter hole 156 (i.e. distance between the sides of the first emitter hole 156 in the longitudinal direction). The first pair of notches 168*a*, 168*b* contain two end portions that extend within the respective side portion from the bottom of the side portion and a central portion that extends between the end portions. The first pair of notches 168*a*, 168*b* extend from one side of the respective side portion to the other side of the respective side portion.

The second pair of notches 170*a*, 170*b* are spaced apart and located with one notch 170*a* located within one side portion and the second notch 170*b* located within the opposed side portion. The second pair of notches 170*a*, 170*b* are aligned in the axial direction. Notch 170*a* is preferably proximate one axial side of the second emitter hole 158, and notch 170*b* is preferably proximate the second axial side of the second emitter hole 158. The second pair of notches 170*a*, 170*b* preferably each have the same dimensions (width, length, and height), wherein the length of the second pair of notches 170*a*, 170*b*, extending in the longitudinal direction, is the same or similar to the length of the second emitter hole 158 (i.e. distance between the sides of the second emitter hole 158 in the longitudinal direction). The second pair of notches 170*a*, 170*b* contain two end portions that extend within the respective side portion from the bottom of the side portion and a central portion that extends between the end portions. The second pair of notches 170*a*, 170*b* extend from one side of the respective side portion to the other side of the respective side portion. Preferably, the first pair of notches 168*a*, 168*b* and a second pair of notches 170*a*, 170*b* have the same dimensions (length, width, and height).

The electrode cleaning apparatus 154 is disposed on the upper internal support 44 of the first portion 14 of the housing 12, as shown in FIGS. 6A and 6B. The top side of the upper internal support 44 contains spaced-apart stops 172*a,b* disposed between the first electrode assembly receptacle 50 and the second electrode assembly receptacle 52. Stop 172*a* is proximate the first electrode assembly receptacle 50 and stop 172*b* is proximate the second electrode assembly receptacle 52. The electrode cleaning apparatus 154 is positioned on the upper internal support 44 so that stop 172*a* is positioned within the first pair of notches 168*a*, 168*b* and stop 172*b* is positioned within the second pair of notches 170*a,b*. The electrode cleaning apparatus 154 slides perpendicular to the stops 172*a*, 172*b* along the respective notches 168*a,b* and 170*a,b*, When the electrode cleaning apparatus 154 is sliding over the stops 172*a,b*, the stops 172*a*, 172*b* curtails the movement of the electrode cleaning apparatus 154 by preventing movement past each end of the notches 168*a*.b and 170*a,b*. When an end of the notches 68*a*.b and 170*a,b* contacts a stop 172*a,b*, the movement in that particular direction of the electrode cleaning apparatus 154 is stopped. Two spaced apart fins 174*a*, 174*b* extend outward from the base portion 66 of the second portion 16 and disposed in close proximity to the upper internal support 44 for the first portion 14 and the second portion 16. The fins 174*a*, 174*b* are disposed in close proximity to the top side of the electrode cleaning apparatus 154, wherein fin 174*a* is disposed in close proximity to the shoulder 164 and fin 174*b* in close proximity to the second emitter hole 158. The fin 174*a* may contact the shoulder 164 to prevent further movement in that direction, and likewise the fin 174*b* may contact the tapered surfaces 166*a,b* of the raised surface 162 preventing further movement in that direction.

An electrode 150 is disposed adjacent the first emitter hole 156 and the other electrode 150 is disposed adjacent the second emitter hole 158, as shown in FIGS. 1 and 2. The electrodes 150 may be positioned adjacent the first emitter hole 156 and the second emitter hole 158, and preferably, the electrodes 150 are positioned such that the emitter end, which is distal to the end coupled to either the first voltage wire 146 or second voltage wire 148 is positioned within the first emitter hole 156 and second emitter hole 158 or below the first emitter hole 156 and second emitter hole 158. Alternatively, each electrode 150 may extend through the first emitter hole 156 and the second emitter hole 158, wherein the electrodes 150 extend above the planar surface of the top side of the electrode cleaning apparatus 154.

During use, the motor 126 is activated, rotating the rotational shaft that rotates the drive wheel 128, as shown in FIGS. 5A and 5B. As the drive wheel 128 rotates, the knob 132, slidingly engaged to the slot 160, rotates, causing the knob 132 to slide within the slot 160 or transverse the slot 160, causing the electrode cleaning apparatus 154 to move within the cavity 32 of the housing, as shown in FIGS. 6A and 6B. The electrode cleaning apparatus 154 moves or slides within the housing 12 along the upper internal support 44. As the electrode cleaning apparatus 154 moves or slides from a first position to a second position, returning to the first position, the sides of the first emitter hole 156 contact the electrode 150 extending through or adjacent the first emitter hole 156 and the sides of the second emitter hole 158 contact the electrode 150 extending through or adjacent the second emitter hole 158 for removing particulate matter, such as dust, dirt, or other substances attached to the electrodes 150 during operation, as illustrated in FIGS. 6A and 6B. Alternatively, or in addition thereto, as the electrode cleaning apparatus 154 moves or slides, the bottom side of the electrode cleaning apparatus 154 contacts the electrodes 150 for removing dust, dirt, or other substances attached to the electrodes 150 during operation. One or more cleaning flanges 176 may be disposed on the electrode cleaning apparatus, preferably on the bottom side of the electrode cleaning apparatus 154, that contacts the electrodes 150 as the electrode cleaning apparatus 154 moves or slides, thus removing the particulate matter or other debris from the electrodes 150. Preferably, the electrode cleaning apparatus 154 will move or slide more than one time, preferably two times, and more preferably a plurality of times, causing the sides of the first emitter hole 156 and second emitter hole 158 and/or the bottom side of the electrode cleaning apparatus 154 to contact each electrode 150 multiple times.

The electrode cleaning apparatus 154 is retained within the housing 12 by the top portion of the first portion 14 and the top potion of the second portion 16. When the first portion 14 and the second portion 16 are engaged, the top portion of the first portion 14 and the top portion of the second portion 16 overlap or extend over the top side of the electrode cleaning apparatus 154, retaining the electrode cleaning apparatus 154 in the housing 12 and preventing the electrode cleaning apparatus 154 from proceeding through the ion opening 34.

During use, once power is provided to the control module 140 of the device 10, the device 10 initiates an internal check on all systems. After initializing and the check has confirmed all systems are operational, the light on the light aperture 58 will blink "on" indicating power has been supplied to the device 10 and the device is in the "on" position. The light is powered by the control module 140. The cleaning cycle, whereby the electrode cleaning apparatus 154 moves or slides within the housing 12 and contacting the electrodes 150, may be manually activated, such as pushing a button positioned on the housing 12, initiating a cleaning cycle, causing the motor 126 to engage, thus rotating the rotational shaft, and causing the drive wheel 128 to rotate, rotating the knob 132 that slides or translates within the slot 160 resulting in movement or sliding of the electrode cleaning apparatus 154. The cleaning cycle is controlled by the control module 140. The electrode cleaning apparatus 154 moves or slides over the electrode 150 adjacent the first emitter hole 156 and the electrode 150 adjacent the second emitter hole 158, performing the cleaning function by removing particular matter or other substances from the electrodes 150. The control module 140 contains the logic for initiating and controlling the cleaning cycle, whereby power is supplied to the motor 126, causing the rotational shaft of the motor 126 to rotate. The logic controls the operation of the motor 126 (the speed, time intervals, and length of time the rotational shaft of the motor 126 rotates) and thus controls the operation of the electrode cleaning apparatus 154, such as speed the electrode cleaning apparatus 154 slides or translates, the time intervals the electrode cleaning apparatus 154 slides or translates, and the length of time the electrode cleaning apparatus 154 slides or translates.

The motor 126 may be operationally connected to a timing circuit of the control module 140 that activates the motor 126 at a predetermined interval. By way of example only, the motor 126 may be activated between every 12 to 24 hours, thus causing the electrode cleaning apparatus 154 to move or slide, cleaning the electrodes 150 every 12 to 24 hours. While the motor 126 is activated, current/voltage is not supplied to the first voltage wire 146 and the second voltage wire 148 by the ionization module, resulting in the temporary stoppage of the emission of ions from the electrodes 150.

The device 10 is designed to be low profile, meaning it is able to be installed in places where space is at a minimum or have a design that occupies a minimum amount of space. The width of the device is between about 15 mm to about 40 mm, preferably between about 20 mm to about 35 mm, and more preferably about 25 mm to about 30 mm.

In one embodiment and use, the device 10 is positioned and secured in place within the housing of the air handler unit such that the electrodes 150 are aligned generally perpendicularly to the direction of the airflow across the device 10, to prevent recombination of the positively charged ions with the negatively charged ions. One or more device(s) 10 can be installed within the housing of each air handler unit, as required to generate the desired level of ion delivery for a given airflow, as may be determined by the airflow rate (CFM) of the fan and ion discharge rate of each device 10. The device(s) 10 are preferably positioned generally centrally in relation to the airflow or evenly distributed across the airflow path. If more than one device 10 is provided in an air handler unit, they are sufficiently spaced and positioned relative to one another to minimize recombination of positive ions with negative ions.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A device for generating ions, comprising:

a housing with a first portion and a second portion having a cavity therein;

a first electrode and a second electrode for emitting ions;

an electrode cleaning apparatus slidingly disposed within the cavity of the housing configured to contact both the first electrode and the second electrode, the electrode cleaning apparatus contains an axially extending slot that is slidingly engaged to a motor, causing the electrode cleaning apparatus to contact the first electrode and the second electrode for cleaning.

2. The device for producing ions according to claim 1, wherein the motor is disposed within the housing.

3. The device for producing ions according to claim 1, wherein the electrode cleaning apparatus contains two spaced-apart emitter holes and an electrode of the device for producing ions is positioned adjacent each emitter hole of the cleaning apparatus.

4. The device for producing ions according to claim 1, wherein the device has a width between about 20 mm to about 30 mm.

5. A device for generating ions, comprising:

a housing with a first portion and a second portion having a cavity therein;

a first voltage wire and a second voltage wire electrically coupled to an ionization module;

a first electrode electrically coupled to the first voltage wire configured to emit ions and a second electrode electrically coupled to the second voltage wire configured to emit ions; and an electrode cleaning apparatus slidingly disposed within the cavity of the housing containing a first emitter hole and a second emitter hole spaced-apart from each other and a first cleaning flange disposed adjacent the first emitter hole and a second cleaning flange disposed adjacent the second emitter hole, wherein the first electrode is positioned adjacent the first emitter hole and the second electrode is positioned adjacent the second emitter hole, the first cleaning flange is configured to contact the first electrode and the second cleaning flange is configured to contact the second electrode, the electrode cleaning apparatus contains an axially extending slot that is slidingly engaged to a drive wheel engaged to a motor, causing the first cleaning flange to contact the first electrode and the second cleaning flange to contact the second electrode for cleaning.

6. The device for producing ions according to claim 5, wherein the motor is disposed within the housing.

7. The device for producing ions according to claim 5, wherein the device has a width between about 20 mm to about 30 mm.

8. The device for producing ions according to claim 5, further comprising a knob disposed on the drive wheel that is received within the axially extending slot of the electrode cleaning apparatus and configured to slide within the axially extending slot of the electrode cleaning apparatus.

9. The device for producing ions according to claim 5, wherein the first emitter hole and the second emitter hole have a square shape.

10. The device for producing ions according to claim 5, wherein the motor contains a rotational shaft engaged to the drive wheel for rotating the drive wheel.

11. The device for producing ions according to claim 5, further comprising a mounting member for mounting the device.

12. The device for producing ions according to claim 11, wherein the mounting member is selectively secured to the device and includes a base member and a side member.

* * * * *